(12) United States Patent
Park et al.

(10) Patent No.: US 9,741,560 B2
(45) Date of Patent: Aug. 22, 2017

(54) METHOD OF GROWING NITRIDE SEMICONDUCTOR LAYER

(71) Applicant: Samsung Electronics Co., Ltd., Suwon-Si, Gyeonggi-Do (KR)

(72) Inventors: Sung-soo Park, Seongnam-si (KR); Moon-sang Lee, Seoul (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/733,632

(22) Filed: Jan. 3, 2013

(65) Prior Publication Data

US 2013/0175541 A1 Jul. 11, 2013

(30) Foreign Application Priority Data

Jan. 10, 2012 (KR) .................. 10-2012-0003085

(51) Int. Cl.
| | |
|---|---|
| *H01L 21/20* | (2006.01) |
| *H01L 21/36* | (2006.01) |
| *H01L 21/02* | (2006.01) |
| *H01L 29/20* | (2006.01) |
| H01L 21/3065 | (2006.01) |

(52) U.S. Cl.
CPC .... *H01L 21/02389* (2013.01); *H01L 21/0254* (2013.01); *H01L 21/02381* (2013.01); *H01L 21/02439* (2013.01); *H01L 21/02458* (2013.01); *H01L 21/02505* (2013.01); *H01L 21/02664* (2013.01); *H01L 29/2003* (2013.01); *H01L 21/3065* (2013.01)

(58) Field of Classification Search
CPC ................................. H01L 21/02389
USPC .............................. 257/76; 438/478
See application file for complete search history.

(56) References Cited

U.S. PATENT DOCUMENTS

| | | | | |
|---|---|---|---|---|
| 5,679,152 | A | * 10/1997 | Tischler | B82Y 15/00 117/1 |
| 5,863,811 | A | 1/1999 | Kawai et al. | |
| 6,156,581 | A | 12/2000 | Vaudo et al. | |
| 6,177,292 | B1 * | 1/2001 | Hong et al. | 438/46 |
| 6,475,882 | B1 | 11/2002 | Sakai et al. | |
| 6,673,149 | B1 * | 1/2004 | Solomon et al. | 117/90 |

(Continued)

FOREIGN PATENT DOCUMENTS

| | | |
|---|---|---|
| CN | 101509146 A | 8/2009 |
| JP | 2002-316892 A | 10/2002 |

(Continued)

OTHER PUBLICATIONS

Extended Search Report for corresponding European Application No. 13150658.6 dated Apr. 24, 2013.

(Continued)

*Primary Examiner* — Igwe U Anya
(74) *Attorney, Agent, or Firm* — Harness, Dickey & Pierce, P.L.C.

(57) ABSTRACT

A method of growing a nitride semiconductor layer may include preparing a substrate in a reactor, growing a first nitride semiconductor on the substrate at a first temperature, the first nitride semiconductor having a thermal expansion coefficient different from a thermal expansion coefficient of the substrate, and removing the substrate at a second temperature.

18 Claims, 10 Drawing Sheets

(56) References Cited

U.S. PATENT DOCUMENTS

| | | | |
|---|---|---|---|
| 6,958,093 B2 * | 10/2005 | Vaudo et al. | 117/90 |
| 7,211,852 B2 | 5/2007 | Ramdani et al. | |
| 7,479,188 B2 | 1/2009 | Yao et al. | |
| 7,794,542 B2 | 9/2010 | Tischler et al. | |
| 7,863,164 B2 | 1/2011 | Chou et al. | |
| 7,863,167 B2 | 1/2011 | Sato et al. | |
| 2001/0008656 A1 | 7/2001 | Tischler et al. | |
| 2001/0016404 A1 | 8/2001 | Hayakawa | |
| 2001/0055660 A1 | 12/2001 | Tischler et al. | |
| 2002/0028314 A1 | 3/2002 | Tischler et al. | |
| 2002/0197830 A1 * | 12/2002 | Watanabe et al. | 438/492 |
| 2004/0107891 A1 * | 6/2004 | Nagai | C30B 25/02 117/2 |
| 2005/0032345 A1 * | 2/2005 | Kryliouk | C30B 25/02 438/604 |
| 2005/0072353 A1 | 4/2005 | Lee et al. | |
| 2005/0194593 A1 | 9/2005 | Ramdani et al. | |
| 2006/0032432 A1 | 2/2006 | Tischler et al. | |
| 2006/0057821 A1 * | 3/2006 | Lee | H01L 21/3065 438/459 |
| 2006/0115933 A1 * | 6/2006 | Ye | H01L 21/02381 438/139 |
| 2007/0108466 A1 * | 5/2007 | Kryliouk | H01L 21/02381 257/103 |
| 2007/0120141 A1 * | 5/2007 | Moustakas et al. | 257/103 |
| 2007/0138505 A1 * | 6/2007 | Preble et al. | 257/190 |
| 2007/0141813 A1 * | 6/2007 | Song | 438/483 |
| 2008/0127884 A1 * | 6/2008 | Tischler et al. | 117/106 |
| 2008/0173895 A1 | 7/2008 | Maa et al. | |
| 2009/0075455 A1 * | 3/2009 | Mishra | 438/458 |
| 2009/0098343 A1 * | 4/2009 | Arena et al. | 428/172 |
| 2009/0155986 A1 * | 6/2009 | Lee et al. | 438/478 |
| 2009/0174038 A1 | 7/2009 | Wang | |
| 2009/0209091 A1 * | 8/2009 | Sato et al. | 438/478 |
| 2009/0243043 A1 | 10/2009 | Wang | |
| 2010/0009516 A1 * | 1/2010 | Yao et al. | 438/458 |
| 2010/0120234 A1 | 5/2010 | Yao et al. | |
| 2010/0148174 A1 | 6/2010 | Nakahata et al. | |
| 2010/0229788 A1 | 9/2010 | Lo et al. | |
| 2010/0320506 A1 | 12/2010 | Varangis et al. | |
| 2011/0211607 A1 * | 9/2011 | Takizawa | B82Y 20/00 372/44.011 |
| 2013/0026480 A1 * | 1/2013 | Fenwick | H01L 21/02381 257/76 |
| 2014/0073115 A1 * | 3/2014 | Lee | H01L 21/02263 438/478 |

FOREIGN PATENT DOCUMENTS

| | | | |
|---|---|---|---|
| JP | 2004107114 A | * | 4/2004 |
| JP | 2004-276337 A | | 10/2004 |
| JP | 2005-057196 A | | 3/2005 |
| JP | 2005-064336 A | | 3/2005 |
| JP | 2008-047611 A | | 2/2008 |
| JP | 2009-102217 A | | 5/2009 |
| JP | 2009-190936 A | | 8/2009 |
| JP | 2010-061683 A | | 3/2010 |
| JP | 2012-004486 A | | 1/2012 |
| KR | 2007-0025081 A | | 3/2007 |
| KR | 2007-0115209 A | | 12/2007 |
| KR | 10-2009-0035451 | | 4/2009 |
| WO | WO-96/41906 A1 | | 12/1996 |

OTHER PUBLICATIONS

Chinese Office Action dated Jul. 6, 2016 issued in corresponding Chinese Patent Application No. 201310009042.7 (English translation provided).

Ichiro Yonenaga, et al. "Yield strength and dislocation mobility in plastically deformed bulk single-cyrstal GaN" Journal of Applied Physicas, vol. 90, 6539 (2001).

Japanese Office Action dated Nov. 14, 2016 issued in corresponding Japanese Patent Application No. 2013-002389 (English translation provided).

Bogumilowicz, Y. et al. "Chemical vapour etching of Si, SiGe and Ge with HCl; application to the formation of thin relaxed SiGe buffers and to the revelation of threading dislocations", Semicond. Sci. Technol. vol. 20, pp. 127-134, 2005.

Raghavan, Srinivasan et al. "Growth stresses and cracking in GaN films on (111) Si grown by metalorganic chemical vapor deposition. II. Graded AlGaN buffer layers", Journal of Applied Physics, vol. 98, 2005.

Ishikawa, Hiroyasu et. al. "Thermal stability in GaN on (111) Si substrate", Journal of Crystal Growth, vol. 189/190, pp. 178-182, 1998.

* cited by examiner

METHOD OF GROWING NITRIDE SEMICONDUCTOR LAYER

CROSS-REFERENCE TO RELATED APPLICATIONS

This application claims the benefit of Korean Patent Application No. 10-2012-0003085, filed on Jan. 10, 2012, in the Korean Intellectual Property Office, the disclosure of which is incorporated herein in its entirety by reference.

BACKGROUND

1. Field

Example embodiments relate to methods of growing a nitride semiconductor layer.

2. Description of the Related Art

Electronic industries using nitride semiconductors have drawn attention as fields suitable for development and growth of green industries. In particular, GaN, a nitride semiconductor, is widely used to manufacture a blue light-emitting diode from among red, green, and blue light-emitting diodes, which are essential elements of high power electronic component devices including a light-emitting diode (LED). A blue LED using GaN is more desirable in terms of brightness, lifespan, and internal quantum efficiency to conventional blue light-emitting devices using a semiconductor material, for example, zinc selenide (ZnSe), due to improved physical and chemical characteristics of GaN.

Also, because GaN has a direct transition band gap structure and the band gap is adjustable in a range from about 1.9 eV to about 6.2 eV by using an indium (In) or aluminum (Al) alloy, GaN is useful in optical devices. Also, because GaN has a higher breakdown voltage and is stable at higher temperatures, GaN is useful in various fields, e.g., a relatively high power device and a relatively high temperature electronic device. For example, GaN may be applied to a relatively large electric board using a full color display, a traffic light, a light source of an optical recording medium, and a relatively high power transistor of a vehicle engine.

Because an LED using a GaN substrate has less defects, has identical refractive indices in the GaN substrate and a device layer, and has a thermal conductivity that is about 4 times higher than that of sapphire, GaN is an essential element for manufacturing a relatively high power LED.

Because gallium nitride (GaN) from among nitride semi-conductors has a band gap energy of about 3.39 eV and is a relatively wide band gap semiconductor material with a direct transition band gap, GaN is useful to manufacture a light-emitting device for emitting light having a relatively short wavelength.

Because growth of a single crystal of GaN in a liquid phase requires a relatively high temperature equal to or higher than about 1500° C. and a nitrogen atmosphere of about 20,000 atm due to a relatively high nitrogen vapor pressure at a melting point, mass producing the single crystal of GaN may be difficult. Also, because a size of the single crystal of GaN that may be currently used is about 100 mm$^2$, using the single crystal of GaN to manufacture a device may be difficult.

Accordingly, a GaN thin film is grown on a heterogeneous substrate by using a vapor deposition method, e.g., metal organic chemical vapor deposition (MOCVD) or hydride vapor phase epitaxy (HVPE).

However, when GaN grown on a silicon substrate directly contacts silicon, the silicon may diffuse into the GaN, a surface of the silicon substrate may be etched to cause meltback, and cracks may occur due to a tensile stress when the GaN is grown on the silicon substrate due to a difference in a thermal expansion coefficient and a lattice constant between the silicon and the GaN. To solve this problem, although a method of growing GaN on a silicon substrate by using a graded buffer layer is used, the method may include growing a GaN thin film but has a limitation in growing a thick GaN layer.

SUMMARY

Example embodiments provide methods of growing a nitride semiconductor that may reduce crack generation and/or propagation or bowings due to the presence of a tensile stress caused by a difference in a lattice constant or a thermal expansion coefficient when the nitride semiconductor is grown on a substrate.

Additional aspects will be set forth in part in the description which follows and, in part, will be apparent from the description, or may be learned by practice of example embodiments.

According to example embodiments, a method of growing a nitride semiconductor layer may include preparing a substrate in a reactor, growing a first nitride semiconductor on the substrate at a first temperature, the first nitride semiconductor having a thermal expansion coefficient different from a thermal expansion coefficient of the substrate, and removing the substrate at a second temperature.

The first nitride semiconductor may be grown on the substrate at the first temperature equal to or higher than 950° C., and the substrate may be removed at the second temperature equal to or higher than 400° C. The first nitride semiconductor may include gallium nitride. The reactor may be a hydride vapor phase epitaxy (HVPE) reactor, the substrate may be prepared in the HVPE, and the first nitride semiconductor may be grown using HVPE.

The first nitride semiconductor may be grown on the substrate at the first temperature ranging from about 950° C. to about 1100° C. A second nitride semiconductor may be stacked on the first nitride semiconductor after the removing the substrate. The second nitride semiconductor may have a thickness equal to or greater than about 10 μm. The first and second nitride semiconductors may include gallium nitride.

A buffer layer may be formed on the substrate before growing the first nitride semiconductor, and the first nitride semiconductor may be grown on the buffer layer. The substrate may be removed by etching. The substrate may be etched after growing the first nitride semiconductor, and the first nitride semiconductor may have a thickness ranging from about 1 μm to about several mm. The substrate may be etched using an HCl gas in the reactor. The HCl gas may have a partial pressure ranging from about 1% to about 100%.

The substrate may be etched until an N-face surface of the first nitride semiconductor is exposed. The substrate may be removed at the second temperature ranging from about 400° C. to about 1100° C. The substrate may be etched during or after growing the first nitride semiconductor. Etching the substrate may include moving the substrate from the reactor to another chamber after growing the first nitride semiconductor and etching the substrate.

A buffer layer may be formed on the substrate before growing the first nitride semiconductor, and the first nitride semiconductor may be grown on the buffer layer. The buffer layer may be formed using any one of metal chemical vapor deposition (MOCVD), sputtering, and HVPE. The buffer layer may include any one of AlN, TaN, TiN, HfN, GaN, and AlGaN. The buffer layer may have a thickness ranging from about 10 nm to about 3 μm. The buffer layer may have a 3-fold symmetrical crystal structure.

The first and second nitride semiconductors may form a nitride semiconductor layer used as a freestanding nitride semiconductor substrate. The nitride semiconductor layer may have a thickness ranging from 1 μm to 3 mm and a diameter ranging from 10 mm to 18 inches.

According to example embodiments, a nitride semiconductor wafer may include at least one nitride semiconductor layer, wherein the at least one nitride semiconductor layer may be grown at a first temperature on a substrate that is prepared in a reactor, the substrate having a thermal expansion coefficient different from a thermal expansion coefficient of the at least one nitride semiconductor layer, and the substrate may be removed at a second temperature.

The first temperature may be equal to or higher than about 950° C. and the second temperature may be equal to or higher than about and about 400° C. The at least one nitride semiconductor layer may include a first nitride semiconductor layer that is grown before the substrate is removed. The first nitride semiconductor layer may be grown by using hydride vapor phase epitaxy (HVPE), and the first temperature may range from about 950° C. to about 1100° C. The at least one nitride semiconductor layer may further include a second nitride semiconductor layer that is grown on the first nitride semiconductor layer after the substrate is removed.

The second nitride semiconductor layer may have a thickness equal to or greater than about 10 μm. A thickness of the first nitride semiconductor layer may range from about 1 μm to about several mm. The second temperature may range from about 400° C. to about 1100° C. The at least one nitride semiconductor layer may be a gallium nitride semiconductor layer.

According to the method, because cracks or bowings occurring due to a tensile stress caused by a difference in a lattice constant or a thermal expansion coefficient when a nitride semiconductor is grown on a substrate are reduced, a high-quality freestanding nitride semiconductor substrate may be manufactured.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
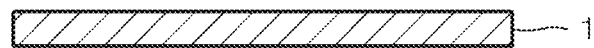
FIGS. 1A through 4 are cross-sectional views for explaining a method of growing a nitride semiconductor, according to example embodiments.

Example embodiments will hereinafter be described in further detail with reference to the accompanying drawings, in which various embodiments are shown. This disclosure may, however, be embodied in many different forms and should not be construed as limited to example embodiments set forth herein. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

In a method of growing a nitride semiconductor according to example embodiments, a thick nitride semiconductor may be grown without cracks caused due to a difference in a lattice constant and/or a thermal expansion coefficient between a nitride semiconductor and a heterogeneous substrate, e.g., a silicon substrate, by using, for example, hydride vapor phase epitaxy (HVPE).

In order to grow a nitride semiconductor, a substrate is prepared in a reactor, a first nitride semiconductor is stacked on the substrate, and then the substrate is etched in the reactor by using in-situ etching. After the etching process, a second nitride semiconductor layer is additionally stacked on the first nitride semiconductor that is preliminarily stacked to obtain a nitride semiconductor layer having a desired thickness. According to the method, a tensile stress caused by the presence of a difference in a thermal expansion coefficient and/or a lattice constant between the nitride semiconductor (e.g., GaN) and a material (e.g., silicon) of the substrate is removed or reduced, and thus a high-quality freestanding nitride semiconductor substrate, for example, a high-quality freestanding GaN substrate, may be obtained.

Example embodiments will hereinafter be described in further detail with reference to the accompanying drawings, in which various embodiments are shown. In the drawings, the thicknesses of layers and regions are exaggerated for clarity.

FIGS. 1A through 4 are cross-sectional views for explaining a method of growing a nitride semiconductor, according to example embodiments.

Figure 1B:
Figure 1C:
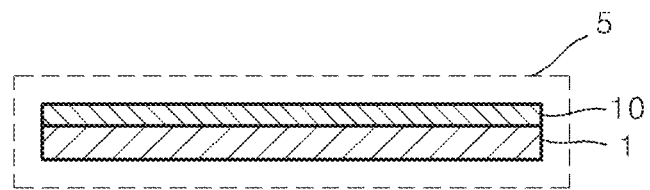
Figure 2:
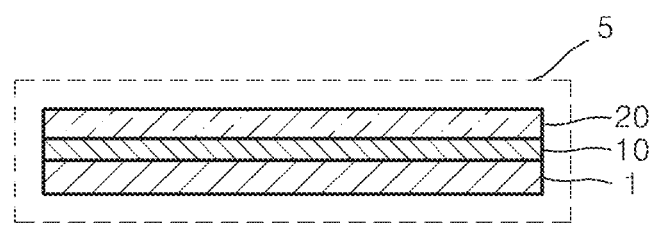
Figure 3A:
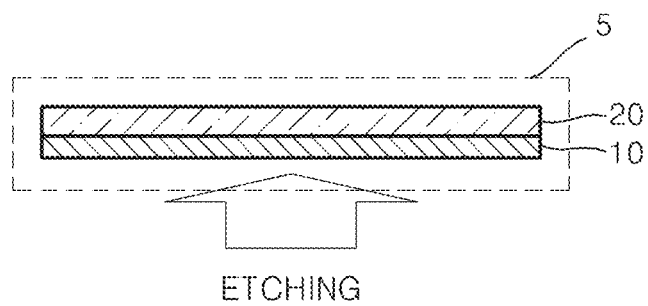
Figure 3B:
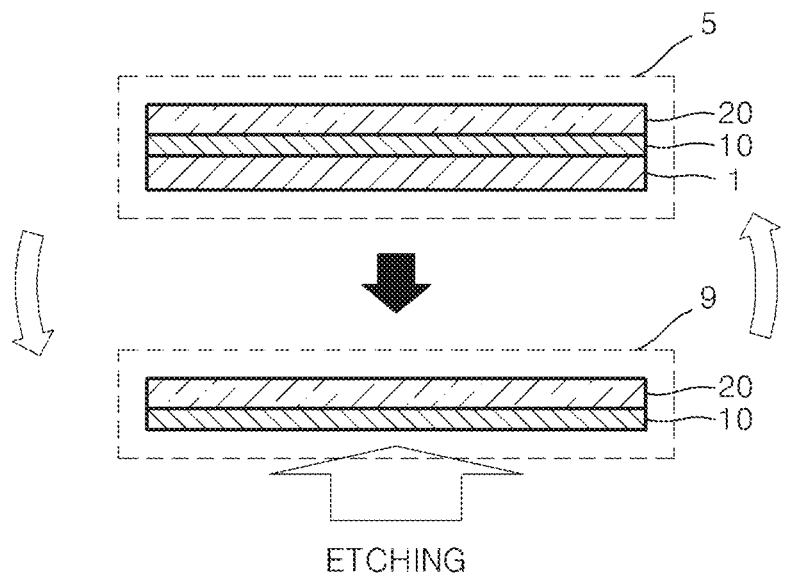
Figure 4:
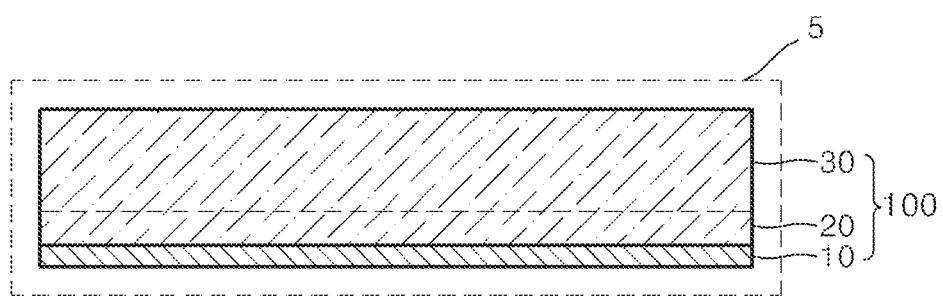

FIGS. 1A through 1C illustrate a process of preparing a substrate 1 on which a nitride semiconductor is grown in a reactor where a process for growing a nitride semiconductor is implemented. FIGS. 2, 3A, and 3B illustrate a process of forming a first nitride semiconductor 20 on the substrate 1 and removing the substrate 1. FIG. 4 illustrates a process of further forming a second nitride semiconductor 30 on the first nitride semiconductor 20 to obtain a nitride semiconductor layer 100 with a desired thickness.

Referring to FIG. 1A, the substrate 1 may be, for example, a silicon substrate. For example, the substrate 1 may be a silicon substrate having a thickness ranging from about 100 µm to about 1000 µm and a diameter ranging from about 10 mm to about 18 inches. The nitride semiconductor layer 100 which may be applied to a freestanding nitride semiconductor substrate 200 of FIG. 4 may be manufactured by using the substrate 1 as shown in FIG. 1A. Therefore, the nitride semiconductor layer 100 may have a size corresponding to the size of the substrate 1. For example, a thickness of the nitride semiconductor layer 100 may in a range from about 1 µm to about 3 mm, and a diameter may be in a range from about 10 mm to about 18 inches. The freestanding nitride semiconductor substrate 200 including the nitride semiconductor layer 100 may be used as a nitride semiconductor wafer. A diameter or a thickness of the nitride semiconductor layer 100, that is, the freestanding nitride semiconductor substrate 200, manufactured by using the method may vary as desired.

A buffer layer 10 may be formed on the substrate 1 as shown in FIG. 1B. The buffer layer 10 may be used to prevent or inhibit cracks or meltback. Meltback refers to a phenomenon where silicon diffuses into GaN to etch a surface of a silicon substrate when the silicon and the GaN directly contact each other.

The buffer layer 10 may be formed of at least one of AlN, TaN, TiN, HfN, GaN, and AlGaN. That is, the buffer layer 10 may be formed to include a nitride semiconductor. Also, the buffer layer 10 may be formed to have a multi-layer structure by using the above materials. The buffer layer 10 may be formed to a thickness ranging from, for example, about 10 nm to about 3 µm. The buffer layer 10 may be formed to have a 3-fold symmetrical crystal structure for epitaxial growth of the first nitride semiconductor 20, for example, GaN, which is to be subsequently grown on the buffer layer 10. The buffer layer 10 may be formed by using any one of metal organic chemical vapor deposition (MOCVD), sputtering, and HVPE.

When the buffer layer 10 is formed by using MOCVD or sputtering, the buffer layer 10 may be formed on the substrate 1 in a MOCVD or sputtering reactor, and the substrate 1 may be mounted in a reactor 5 as shown in FIG. 1C. A process for growing a nitride semiconductor on the substrate 1 may be implemented in the reactor 5 (hereafter, the term "reactor" refers to, unless noted otherwise, the reactor 5 where a nitride semiconductor is grown). The substrate 1 used to stack a nitride semiconductor may be prepared in the reactor 5, and the first nitride semiconductor 20 may be grown on the buffer layer 10 by stacking the nitride semiconductor as shown in FIG. 2.

Figure 7:
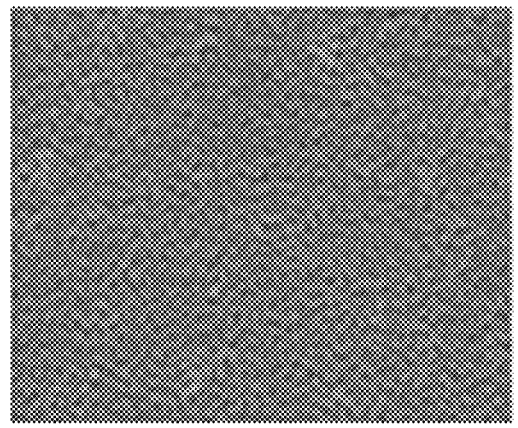
FIG. 7 is an image illustrating a GaN buffer layer grown on a silicon substrate by using hydride vapor phase epitaxy (HVPE), according to example embodiments.

When the buffer layer 10 is formed by using HVPE, the buffer layer 10 may be formed after mounting the substrate 1 in the reactor 5 in FIG. 1A or 1B. Therefore, the substrate 1 for stacking a nitride semiconductor may be prepared in the reactor 5, and the nitride semiconductor may be stacked in the reactor 5. Alternatively, the buffer layer 10 may be formed on the substrate 1 by using HVPE in a separated reactor and move the substrate 1 with the buffer layer 10 into the reactor for growing a nitride semiconductor, or forming the buffer layer 10 on the substrate 1 and growing a nitride semiconductor on the buffer layer may be conducted in the same reactor, that is, the reactor 5, with different processes. When the reactor 5 has a configuration that allows MOCVD or sputtering, the buffer layer 10 may be formed by using MOCVD or sputtering when the substrate 1 is mounted in the reactor 5. FIG. 7 is an image illustrating a GaN buffer layer grown on a silicon substrate by using HVPE, according to example embodiments.

As described above, the substrate 1 may be prepared in the reactor 5, and the first nitride semiconductor 20, for example, first GaN, may be preliminarily stacked on the substrate 1 to a predetermined or given thickness, as shown in FIG. 2. The reactor 5 may be an HVPE reactor, and the first nitride semiconductor 20 may be stacked by using HVPE. For example, in the HVPE reactor, GaCl may be generated by reacting HCl with Ga metal and the first GaN may be preliminarily stacked on the buffer layer 10 by reacting the GaCl with $NH_3$.

In example embodiments, the first nitride semiconductor 20 may be stacked at a temperature ranging from about 950° C. to about 1100° C. Also, the first nitride semiconductor 20 may be preliminarily stacked to a thickness ranging, for example, from about 1 μm to about several mm, e.g., from several μm to several tens of μm.

Figure 8:
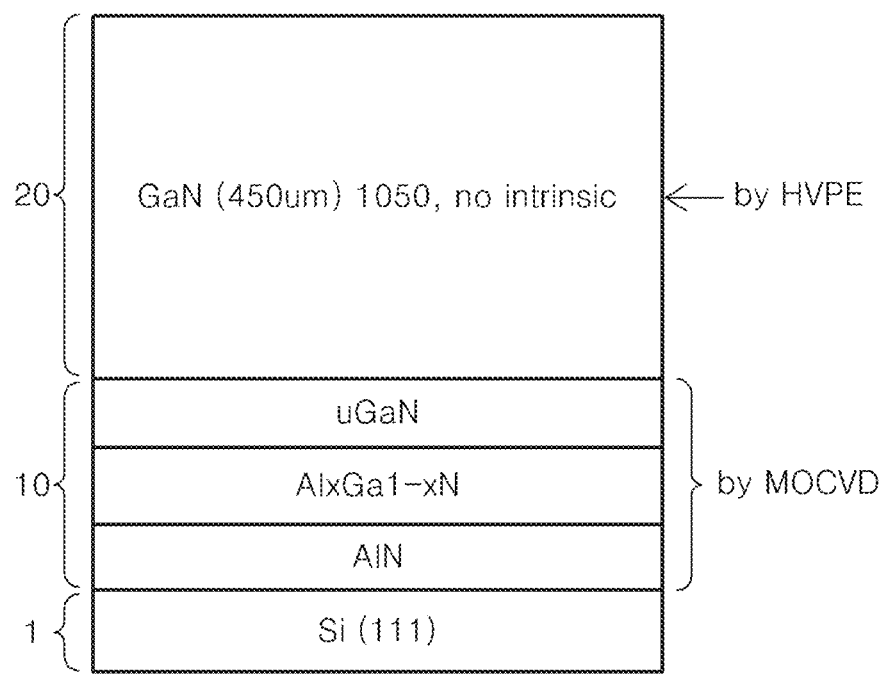
FIG. 8 is a cross-sectional view illustrating a layer structure in which the buffer layer and a first nitride semiconductor layer are formed on a substrate, according to example embodiments.

FIG. 8 is a cross-sectional view illustrating a layer structure in which the buffer layer 10 and the first nitride semiconductor 20 are formed on the substrate 1, according to example embodiments.

Referring to FIG. 8, a silicon substrate whose orientation is (111) may be used as the substrate 1. The buffer layer 10 may have a 3-layer structure including, for example, a AlN layer, an AlxGa1−xN layer, and a μGaN layer, by using MOCVD. The first nitride semiconductor 20 may be formed of GaN to a thickness of, for example, about 450 μm, at a growth temperature of about 1050° C., by using HVPE.

Referring to FIGS. 3A and 3B, as described above, a relatively thin freestanding nitride semiconductor substrate structure from which the substrate 1 is removed may be obtained by removing, for example, etching, the substrate 1 in a state where the first nitride semiconductor 20 is preliminarily stacked.

FIGS. 3A and 3B are cross-sectional views for explaining methods of removing the substrate 1 in a state where the first nitride semiconductor 20 is stacked, according to example embodiments.

Referring to FIG. 3A, the substrate 1 may be removed in the reactor 5 by using in-situ etching. That is, the substrate 1 may be removed by using etching in the reactor 5 where the first nitride semiconductor 20 is grown.

Referring to FIG. 3B, the substrate 1 may be removed in a separate etching chamber 9, instead of being removed in the reactor 5 by using in-situ etching. That is, after the substrate 1 on which the first nitride semiconductor 20 is stacked is moved to the etching chamber 9, the substrate 1 may be removed by performing etching in the etching chamber 9. A stack structure including the first nitride semiconductor 20 after the substrate 1 is removed may be moved back to the reactor 5 to grow a second nitride semiconductor 30 on the first nitride semiconductor 20.

The substrate 1 may be etched at a temperature equal to or higher than about 400° C. For example, the substrate 1 may be etched at a temperature ranging from about 400° C. to about 1100° C.

Figure 5:
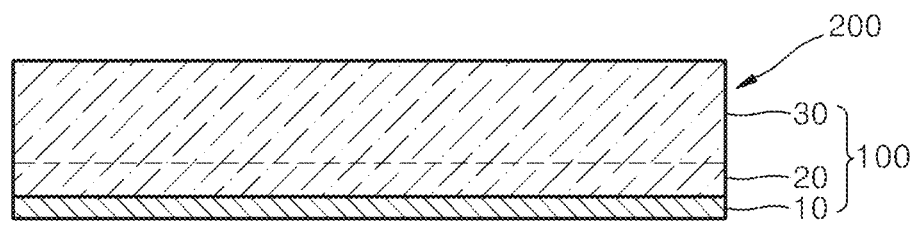
FIGS. 5 and 6 are cross-sectional views illustrating a freestanding nitride semiconductor substrate (a nitride semiconductor wafer) manufactured by using the method of FIGS. 1A through 4, according to embodiments of the present invention.

When the second nitride semiconductor 30, for example, second GaN, is additionally stacked on the first nitride semiconductor 20 that is preliminarily stacked as shown in FIG. 4, the nitride semiconductor layer 100 with a desired thickness may be obtained. The nitride semiconductor layer 100 obtained after the second nitride semiconductor 30 is additionally stacked may be used as the freestanding nitride semiconductor substrate 200, that is, a nitride semiconductor wafer, as shown in FIG. 5. For example, a GaN layer with a desired thickness obtained by additionally stacking the second GaN after removing the substrate 1 on the first GaN that is formed before the substrate 1 is removed (that is, etched) may be used as a freestanding GaN substrate (a GaN wafer).

In example embodiments, the freestanding nitride semiconductor substrate 200 may include the buffer layer 10 as shown in FIG. 5. If necessary, the freestanding nitride semiconductor substrate 200 may not include the buffer layer 10. The buffer layer 10 may be removed after the substrate 1 is etched or after completing the process for stacking the nitride semiconductor layer 100.

The substrate 1 may be removed after growing the first nitride semiconductor 20 up to a thickness ranging from about 1 μm or about several mm, for example, a thickness of several μm or several tens of μm.

The substrate 1 may be etched at a temperature ranging from, for example, about 400° C. to about 1100° C., by using an HCl gas in the reactor 5 or the etching chamber 9. A partial pressure of the HCl gas may be in a range from about 1% to about 100%. The substrate 1 may be etched in the reactor 5 where the first nitride semiconductor 20 is grown as described with reference to FIG. 3A, or may be etched in the etching chamber 9 as described with reference to FIG. 3B. The substrate 1 may be etched until an N-face surface of the first nitride semiconductor 20 is exposed, thereby the substrate may be removed completely.

When the substrate 1 is etched in the reactor 5, the substrate 1 may be etched when a nitride semiconductor stops growing. Alternatively, the substrate 1 may be etched at the same time as a nitride semiconductor is grown. That is, at the same time as the first nitride semiconductor 20 is preliminarily stacked to a predetermined or given thickness and the nitride semiconductor continues to be stacked, the substrate 1 may be etched. The substrate 1 may be etched at the same time as the nitride semiconductor continues to be stacked because the substrate 1 is etched in the reactor 5 by using in-situ etching.

Additionally, the second nitride semiconductor 30 may be grown directly on the first nitride semiconductor 20 that is preliminarily stacked in the reactor 5 by using HVPE to a thickness, for example, equal to or greater than at least 10 μm, for example, a range from about hundreds of μm to about several mm. For example, when the substrate 1 that is a silicon substrate is completely etched, the second GaN may be additionally grown up to a thickness of about 400 μm.

Although the first nitride semiconductor 20 is preliminarily stacked and then the second nitride semiconductor 30 is additionally stacked after or at the same time as the substrate 1 is etched as illustrated in FIGS. 1A through 4, example embodiments are not limited thereto and the nitride semiconductor layer 100 may be grown in various other ways.

Figure 6:
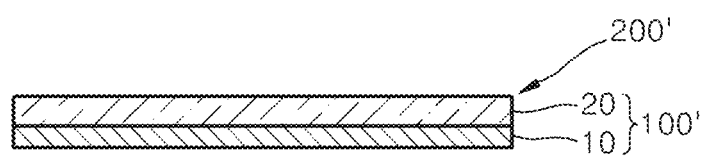

For example, a nitride semiconductor layer 100' may be formed by preliminarily stacking the first nitride semiconductor 20 on the substrate 1 to a desired thickness and then etching the substrate 1, so that a freestanding nitride semiconductor substrate 200' as shown in FIG. 6 may be manufactured without stacking the second nitride semiconductor 30. That is, the freestanding nitride semiconductor substrate 200' may be formed to include only the first nitride semiconductor 20 that is preliminarily stacked without including the second nitride semiconductor 30 that is additionally stacked on the first nitride semiconductor 20. In example embodiments, the freestanding nitride semiconductor substrate 200' may include the buffer layer 10 as shown in FIG. 6. In example embodiments, a process of stacking a nitride semiconductor may be stopped or performed at the same time as the substrate 1 is etched.

Also, although the second nitride semiconductor 30 that is additionally stacked has a thickness greater than that of the first nitride semiconductor 20 in FIGS. 4 and 5, example embodiments are not limited thereto and the second nitride semiconductor 30 that is additionally stacked may have a thickness less than that of the first nitride semiconductor 20.

Accordingly, the nitride semiconductor layer 100 or 100', that is, the freestanding nitride semiconductor substrate 200 or 200', which is obtained by preliminarily stacking the first nitride semiconductor 20 and additionally stacking the second nitride semiconductor 30, or obtained only by preliminarily stacking the first nitride semiconductor 20 without additionally stacking the second nitride semiconductor 30 may have a thickness ranging from, for example, about 1 μm to about 10 mm. The freestanding nitride semiconductor layer 100 or 100', that is, the freestanding nitride semiconductor substrate 200 or 200', manufactured by the method of growing according to example embodiments may be formed to have a thickness suitable for a required diameter.

In the previous examples, the first nitride semiconductor 20 is stacked on a silicon substrate. However, example embodiments are not limited thereto and in order to grow the freestanding nitride semiconductor substrate 200 or 200', for example, a freestanding GaN semiconductor substrate, other types of substrates, for example, a sapphire substrate, instead of the silicon substrate may be used as the substrate 1.

Figure 9:
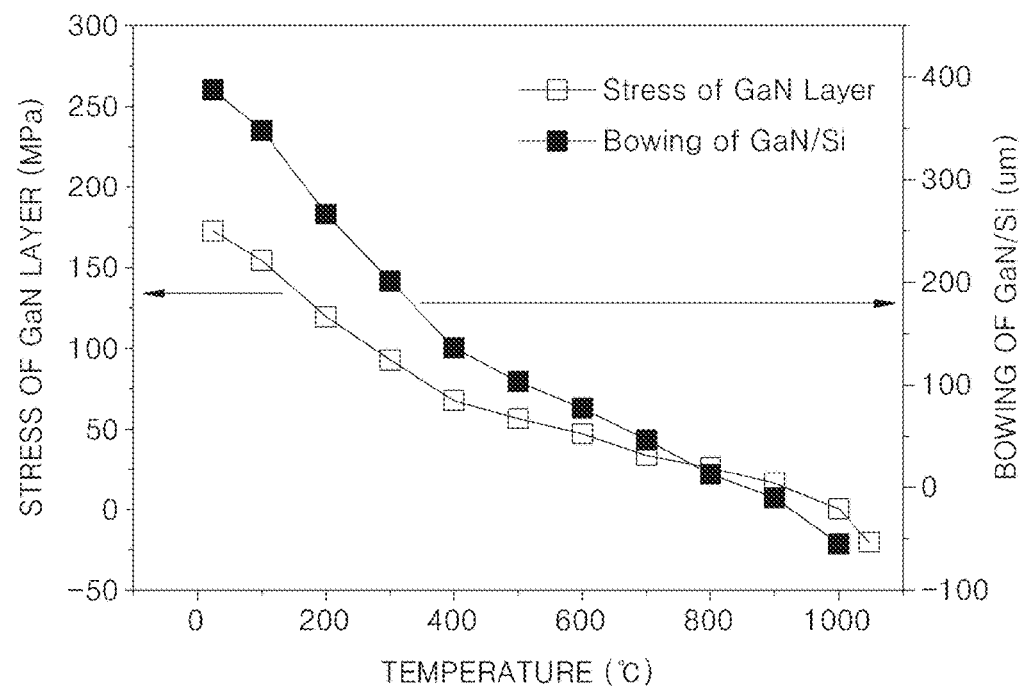
FIG. 9 is a graph illustrating a relationship between a stress of a GaN layer grown on a silicon (Si) substrate by using HVPE and a bowing of a GaN/Si template, and a temperature.

FIG. 9 is a graph illustrating a relationship between a stress of a GaN layer grown on a silicon (Si) substrate by using HVPE and a bowing of a GaN/Si template, and a temperature. In FIG. 9, a thick GaN layer is intrinsically compressed at a growth temperature due to a stress on a thin GaN/Si template. When it is assumed that the stress is −20 MPa, the graph shows results obtained by simulating a stress of the GaN layer and a bowing of the GaN/Si template during cooling after the thick GaN layer is grown.

Referring to FIG. 9, during the cooling after the thick GaN layer is grown, there is no stress at a temperature of about 1000° C. due to a difference between thermal expansion coefficients of GaN and Si, and a tensile stress applied to the thick GaN layer is gradually increased.

A bowing of the GaN/Si changes in a similar fashion. A convex bowing occurs at a temperature equal to or higher than about 850° C., and a concave bowing occurs at a temperature lower than 850° C. Accordingly, a size of a bowing increases as a temperature decreases.

If the thick GaN layer is grown on a silicon substrate and then the silicon substrate is not removed at a temperature equal to or higher than 400° C., cracks may occur in freestanding GaN. According to the results of the simulation, a tensile stress applied to the thick GaN layer at a temperature of 400° C. is about 67 MPa. The value 67 MPa is about ⅓ of 200 MPa which is a yield stress when a compressive stress is applied to the thick GaN layer. The value 67 MPa is almost the same as a yield stress at which cracks occur when a tensile stress is applied.

Figure 10:
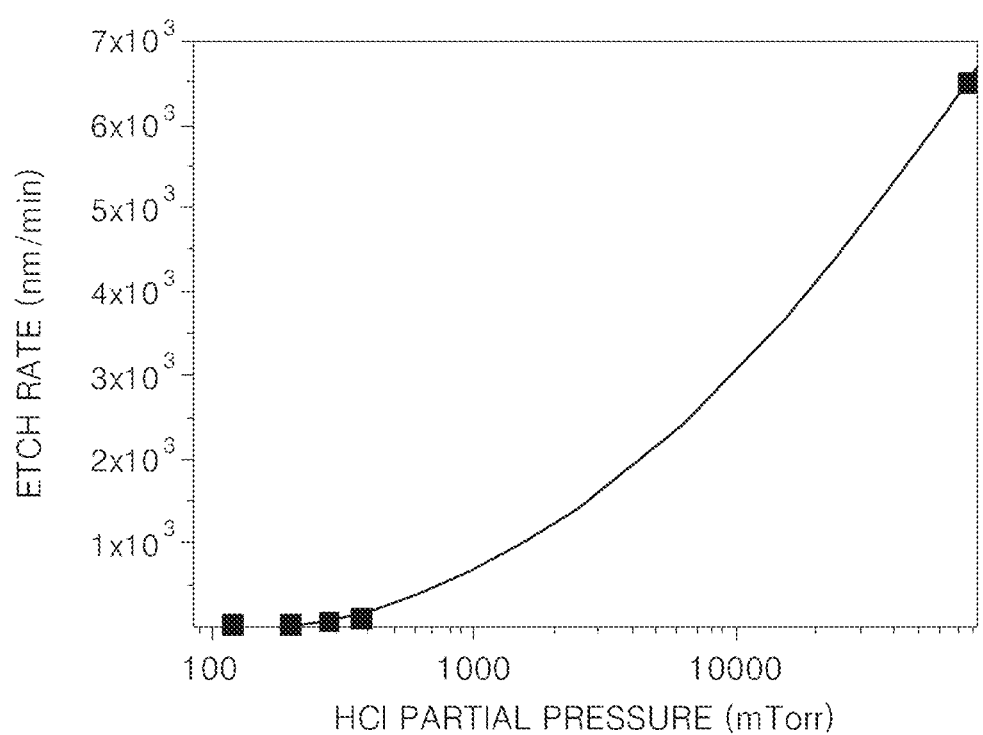
FIG. 10 is a graph illustrating a relationship between an etch rate of silicon in an HVPE reactor and an HCl partial pressure at a temperature of about 1050° C.
Figure 11:
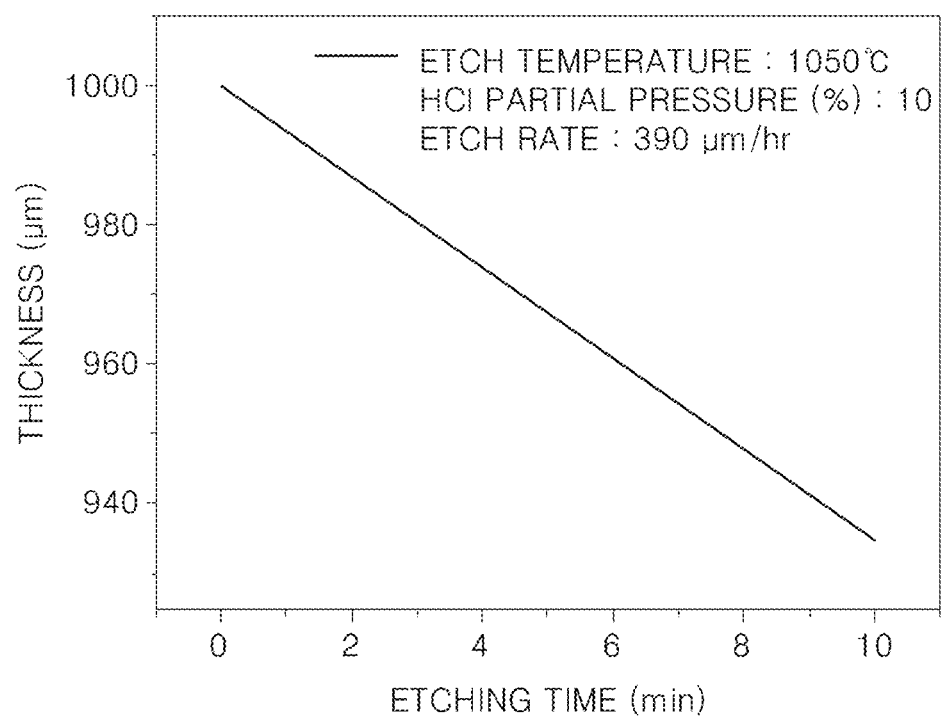
FIG. 11 is a graph illustrating a relationship between a thickness of silicon and an etching time when an HCl partial pressure at a temperature of about 1050° C. is 10%.

FIG. 10 is a graph illustrating a relationship between an etch rate of silicon in an HVPE reactor and an HCl partial pressure at a temperature of about 1050° C. FIG. 11 is a graph illustrating a relationship between a thickness of silicon and an etching time when an HCl partial pressure and an operating temperature are about 10% and about 1050° C. respectively.

As shown in FIGS. 10 and 11, the etch rate may increase as the HCl partial pressure increases, and the thickness of the silicon may decrease as the etching time increases.

Figure 12:
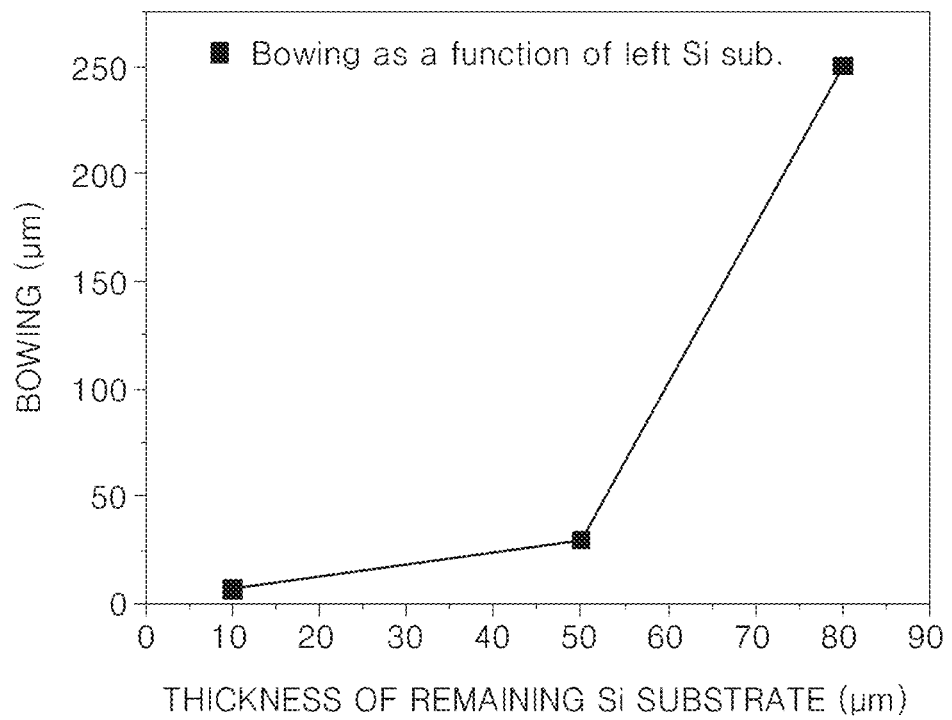
FIG. 12 illustrate a relationship between a blowing of a GaN thick film and a thickness of a silicon substrate when GaN having a thickness of 300 μm is grown on the silicon substrate having a thickness of about 450 μm and then the silicon substrate is etched by using an HCl in an HVPE reactor.

FIG. 12 illustrates a relationship between a degree of a bowing of a GaN film and a remaining thickness of a silicon substrate. The GaN having a thickness of 300 μm is grown on the silicon substrate which has a thickness of about 450 μm. The silicon substrate is etched by using an HCl in HVPE reactor. Referring to FIG. 12, the bowing of the GaN film may decrease as the thickness of the silicon substrate is decreased through the HCl etching, because reduction in the thickness of the substrate decreases thermally induced tensile stress level. That is, in-situ etching of a silicon substrate in the example embodiments enables a freestanding GaN substrate to be grown up to a relatively thick thickness by removing or lowering thermally induced stress in a GaN substrate.

According to the aforementioned method of growing the nitride semiconductor layer 100 or 100', a high-quality GaN wafer may be manufactured. A tensile stress and a bowing on a GaN layer may be removed due to in-situ etching of a silicon substrate in an HVPE reactor when GaN is grown on the silicon substrate. Also, because a silicon substrate is inexpensive and has a relatively large diameter, a large-diameter GaN wafer may be manufactured at a lower cost.

For example, a nitride semiconductor wafer, e.g., a GaN wafer, having a thickness ranging from about 1 μm to about 3 mm and a diameter ranging from about 10 mm to about 18 inches may be manufactured by using a silicon substrate having a thickness ranging from about 100 μm to about 1000 μm and a diameter ranging from about 10 mm to about 18 inches.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A method of growing a nitride semiconductor layer, the method comprising:
   preparing a silicon substrate in a reactor;
   growing a first nitride semiconductor on the silicon substrate at a first temperature equal to or higher than 950° C., the first nitride semiconductor having a thermal expansion coefficient different from a thermal expansion coefficient of the silicon substrate;
   after the growing, removing the silicon substrate by in-situ etching in the reactor at a second temperature different from the first temperature in order to decrease a tensile stress induced by a difference between the thermal expansion coefficient of the first nitride semiconductor and the thermal expansion coefficient of the silicon substrate, the second temperature being equal to or higher than 400° C. and less than 500° C.; and
   stacking a second nitride semiconductor on the first nitride semiconductor in the reactor after the removing the silicon substrate.

2. The method of claim 1, wherein the growing a first nitride semiconductor includes growing gallium nitride.

3. The method of claim 1, wherein the reactor is a hydride vapor phase epitaxy (HVPE) reactor, the preparing a silicon substrate includes preparing the silicon substrate in the HVPE, and the growing a first nitride semiconductor includes growing the first nitride semiconductor using HVPE.

4. The method of claim 3, wherein the growing a first nitride semiconductor includes growing the first nitride semiconductor on the silicon substrate at the first temperature ranging from about 950° C. to about 1100° C.

5. The method of claim 1, wherein the stacking a second nitride semiconductor includes stacking the second nitride semiconductor having a thickness equal to or greater than about 10 μm.

6. The method of claim 1, wherein the growing a first nitride semiconductor includes growing gallium nitride, and wherein the stacking a second nitride semiconductor includes stacking gallium nitride.

7. The method of claim 1, wherein the in-situ etching the silicon substrate includes etching the silicon substrate after the growing a first nitride semiconductor, the first nitride semiconductor having a thickness ranging from about 1 urn to about several mm.

8. The method of claim 1, wherein the in-situ etching the silicon substrate includes using an HCl gas in the reactor.

9. The method of claim 8, wherein the in-situ etching the silicon substrate includes using the HCl gas having a partial pressure ranging from about 1% to about 100%.

10. The method of claim 1, wherein the etching the silicon substrate includes etching the silicon substrate until an N-face surface of the first nitride semiconductor is exposed.

11. The method of claim 1, further comprising:
forming a buffer layer on the silicon substrate before the growing a first nitride semiconductor,
wherein the growing the first nitride semiconductor includes growing the first nitride semiconductor on the buffer layer.

12. The method of claim 11, wherein the forming a buffer layer includes using any one of metal chemical vapor deposition (MOCVD), sputtering, and HVPE.

13. The method of claim 11, wherein the forming a buffer layer includes forming any one of AlN, TaN, TiN, HfN, GaN, and AlGaN.

14. The method of claim 13, wherein the forming a buffer layer includes forming a lower buffer layer, an intermediate buffer layer, and an upper buffer layers, the intermediate buffer layer including AlGaN.

15. The method of claim 11, wherein the forming a buffer layer includes forming the buffer layer having a thickness ranging from about 10 nm to about 3 μm.

16. The method of claim 11, wherein the forming a buffer layer includes forming the buffer layer having a 3-fold symmetrical crystal structure.

17. The method of claim 1, wherein the growing a first nitride semiconductor and the stacking a second nitride semiconductor forms a nitride semiconductor layer used as a freestanding nitride semiconductor silicon substrate.

18. The method of claim 17, wherein the forming a nitride semiconductor layer includes forming the nitride semiconductor layer having a thickness ranging from 1 μm to 3 mm and a diameter ranging from 10 mm to 18 inches.

* * * * *